US012372422B2

(12) United States Patent
Chen et al.

(10) Patent No.: US 12,372,422 B2
(45) Date of Patent: Jul. 29, 2025

(54) SENSOR WITH PLURALITY OF SENSOR ELEMENTS ARRANGED ON A FLEXIBLE SUBSTRATE

(71) Applicant: UNIVERSAL CEMENT CORPORATION, Taipei (TW)

(72) Inventors: Sih-Wei Chen, New Taipei (TW); Chia-Hung Chou, New Taipei (TW); Chih-Sheng Hou, Taipei (TW)

(73) Assignee: UNIVERSAL CEMENT CORPORATION, Taipei (TW)

( * ) Notice: Subject to any disclaimer, the term of this patent is extended or adjusted under 35 U.S.C. 154(b) by 325 days.

(21) Appl. No.: 18/206,067

(22) Filed: Jun. 5, 2023

(65) Prior Publication Data
US 2024/0402024 A1 Dec. 5, 2024

(51) Int. Cl.
*G01L 1/22* (2006.01)
*G01L 1/20* (2006.01)
*H05K 1/18* (2006.01)

(52) U.S. Cl.
CPC ............ *G01L 1/2287* (2013.01); *G01L 1/205* (2013.01); *H05K 1/181* (2013.01); *H05K 1/189* (2013.01); *H05K 2201/09063* (2013.01); *H05K 2201/10151* (2013.01)

(58) Field of Classification Search
CPC ....... G01L 1/2287; G01L 1/205; H05K 1/181; H05K 1/189; H05K 2201/09063; H05K 2201/10151
See application file for complete search history.

(56) References Cited

U.S. PATENT DOCUMENTS

| | | | | |
|---|---|---|---|---|
| 3,503,031 A | * | 3/1970 | Nyhus | G06C 7/02 29/610.1 |
| 4,426,884 A | * | 1/1984 | Polchaninoff | G01L 1/20 600/592 |
| 6,964,205 B2 | * | 11/2005 | Papakostas | G01L 1/20 73/862.046 |
| 10,048,141 B2 | * | 8/2018 | Iwase | G01L 1/2206 |
| 10,690,559 B1 | * | 6/2020 | Liu | H01M 4/02 |
| 2005/0145045 A1 | * | 7/2005 | Papakostas | G01L 1/20 73/864 |
| 2005/0268699 A1 | * | 12/2005 | Papakostas | G01L 1/20 73/46 |

* cited by examiner

*Primary Examiner* — Freddie Kirkland, III
(74) *Attorney, Agent, or Firm* — Winston Hsu

(57) ABSTRACT

A sensor with plurality of sensor elements arranged on a flexible substrate, including a flexible substrate, multiple perforations formed in the flexible substrate, multiple open-ended moat-like cut-out areas formed in the flexible substrate, wherein the perforations and the open-ended moat-like cut-out areas are arranged in a staggered array on the flexible substrate, and each open-ended moat-like cut-out area defines an active area nearly enclosed by one open-ended moat-like cut-out area and connecting the flexible substrate through a bridge feature not enclosed by the open-ended moat-like cut-out area, and multiple sensor elements, wherein each sensor element is set on one active area.

7 Claims, 4 Drawing Sheets

SENSOR WITH PLURALITY OF SENSOR ELEMENTS ARRANGED ON A FLEXIBLE SUBSTRATE

BACKGROUND OF THE INVENTION

1. Field of the Invention

The present invention relates generally to a sensor, and more specifically, to a sensor with plurality of sensor elements arranged regularly on a flexible substrate for frequently stretching, deforming application and circumstance.

2. Description of the Prior Art

Force sensors or pressure sensors are used in equipment required by long-term care or ergonomics application like medical mattress, cushion or back cushion for detecting and recording forces or pressures exerted and distributed on contact surfaces by disabled or physically challenged people, in order to prevent bedsore due to long-time pressure applied to soft tissue resulting in completely or partially obstructed blood flow to the soft tissue. The sensor may be formed on a thin, flat and flexible substrate, including multiple individual sensor elements arranged in rows and columns on the substrate. Forces acting at the sensor elements cause a corresponding change in the electrical resistance of the pressure sensitive ink, which may be subsequently detected by a control circuit through conductive traces electrically coupled to the sensor elements.

Since this kind of pressure sensor is applied in detecting pressure distribution on soft objects like mattress, cushion or pad, the flexible substrate with sensor elements distributed thereon is inevitably subject to irregular local deformation (e.g., curved, non-planar, etc.) resulted from the pressure exerted by users, which may affect the precision and accuracy of pressure detection. In addition, the flexible substrate is also required to have sufficient stretch property in order to provide comfort experience for a long time use. Currently, there are certain pattern designs in prior art, such as mesh design, spiral design, interlocking design or perforated design, to improve the stretchability of flexible substrate as well as minimize the impact of substrate deformation. Nevertheless, in actual implementation, it is very difficult to achieve excellent ability of stretch and anti-deformation at the same time even when using the aforementioned designs. Accordingly, those of skilled in the art still need to improve the design of flexible substrate and sensors in order to aid with the conformability of the sensor.

SUMMARY OF THE INVENTION

In the light of the aforementioned disadvantages in prior art, the present invention hereby provides a novel sensor with multiple sensor elements arranged on a flexible substrate for frequently stretching, deforming application, with features of perforations and open-ended moat-like cut-out areas arranged in a staggered array to create regular, alternating perforated patterns and patterns for active regions immune to the stretch and deformation of the flexible substrate, provided with both the advantages of mesh-type and spiral-type pattern designs.

The objective of present invention is to provide a sensor with plurality of sensor elements arranged on a flexible substrate, including a flexible substrate, multiple perforations formed in the flexible substrate, multiple open-ended moat-like cut-out areas formed in the flexible substrate, wherein the perforations and the open-ended moat-like cut-out areas are arranged in a staggered array on the flexible substrate, and each open-ended moat-like cut-out area defines an active area nearly enclosed by one open-ended moat-like cut-out area and connecting the flexible substrate through a bridge feature not enclosed by the open-ended moat-like cut-out area, and multiple sensor elements, wherein each sensor element is set on one active area.

These and other objectives of the present invention will no doubt become obvious to those of ordinary skill in the art after reading the following detailed description of the preferred embodiment that is illustrated in the various figures and drawings.

Figure 1:
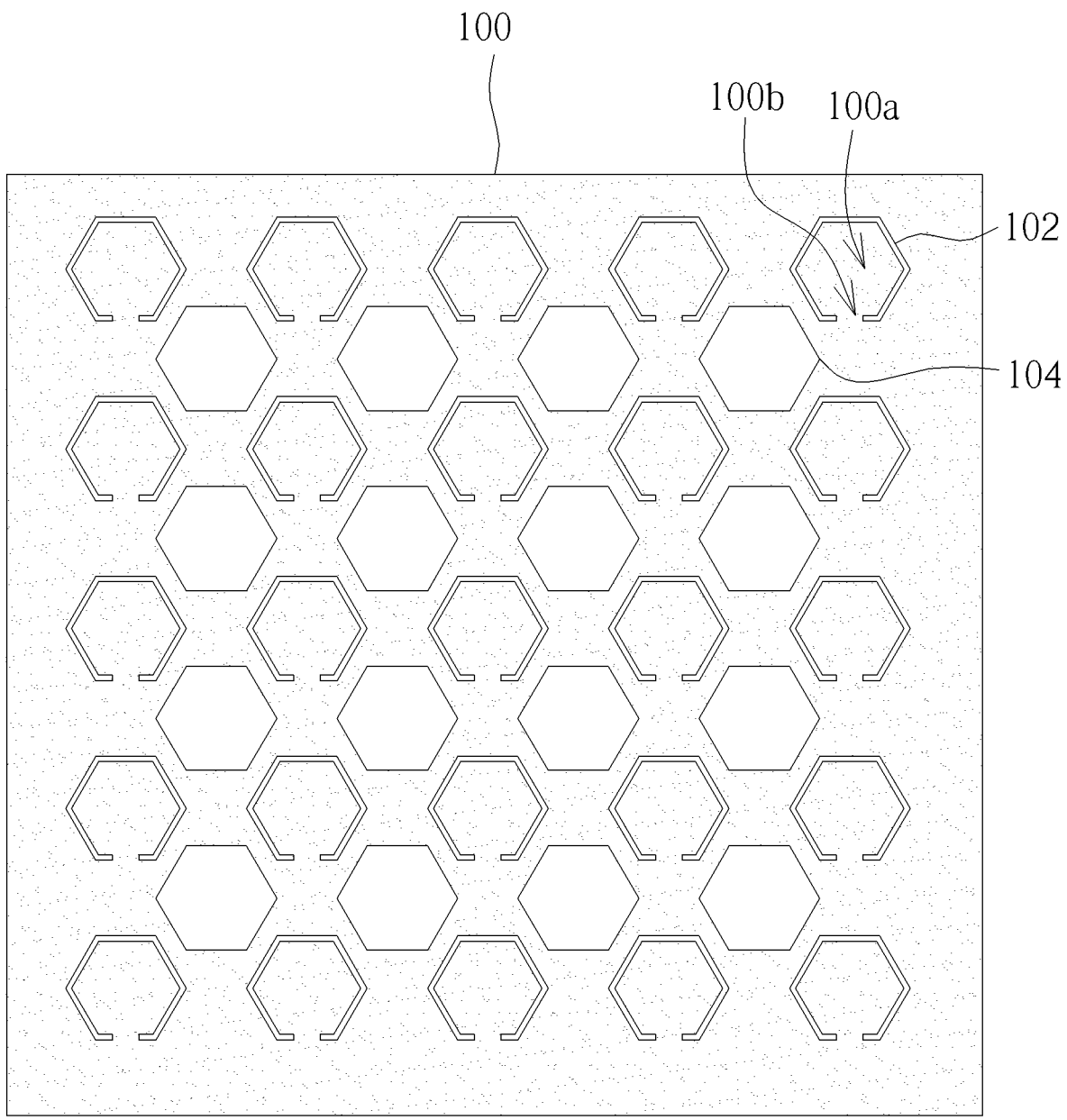
FIG. 1 is a top view of a flexible substrate for the sensor in accordance with one embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Please refer to FIG. 1, which is a top view of a flexible substrate for the sensor in accordance with one embodiment of present invention. The sensor of the present invention is formed designedly on a flexible substrate 100 in order to provide stretchability required in the application. In some embodiment, the flexible substrate 100 may be formed of polymer, such as polyimide (PI), polyamide (PA), polymerized siloxanes, polyurethanes (PU), polyester, thermoplastic polyurethanes (TPU) or polyethylene terephthalate (PET). In other embodiment, the flexible substrate 100 may be fabric, such as Nylon, that can be applied directly in soft objects like mattress, cushion or pad. In some embodiment, the flexible substrate 100 may be provided with single-layered or multilayered structure, for example, a combination of fabric layer and PET layer.

Refer still to FIG. 1, in the embodiment of present invention, specific perforated patterns and cut-out patterns are formed in the flexible substrate 100. These kinds of patterns may render the flexible substrate 100 more stretchability and conformability as well as immune to the impact of substrate deformation. As shown in FIG. 1, multiple perforations 104 are formed in the flexible substrate 100. These perforations 104 are arranged on the flexible substrate 100 in an inline array. Furthermore, multiple open-ended moat-like cut-out areas 102 are formed in the flexible substrate 100. Similarly, these open-ended moat-like cut-out areas 102 are arranged on the flexible substrate 100 in an inline array. Specifically, in the embodiment of present invention, the combination of perforations 104 and open-ended moat-like cut-out areas 102 are arranged in a staggered array on the flexible substrate 100 as shown in FIG. 1, with rows or columns of perforations 104 and rows or columns of open-ended moat-like cut-out areas 102 are alternated and staggered in the array. The perforations 104 and open-ended moat-like cut-out areas 102 may be formed by directly cutting out the material of flexible substrate 100, for example, through laser cutting machine.

Refer still to FIG. 1. In the embodiment of present invention, specifically, each of the open-ended moat-like cut-out areas 102 defines an active area 100a of the flexible substrate 100 that is nearly enclosed by one of the open-ended moat-like cut-out areas 102. Furthermore, the active area 100a is connected with the flexible substrate 100 through one or at least one bridge feature 100b that is not enclosed by the open-ended moat-like cut-out areas 102. The bridge features 100b of flexible substrate 100 preferably face the same direction as shown in FIG. 1. In addition, in the embodiment of present invention, preferably, the active area 100a of the flexible substrate 100 and the perforations 104 have substantially similar or the same dimension and shape, such as the hexagonal shapes with the same dimension as shown in FIG. 1. This design may make the open-ended moat-like cut-out areas 102 and the perforations 104 arranged more closely and uniformly on the flexible substrate 100 and provide better stretchability and conformability to irregularly shaped surface.

In the embodiment of present invention, perforations 104 formed in the flexible substrate 100 may provide flexible substrate 100 excellent and uniform stretchability. The active areas 100a defined by the open-ended moat-like cut-out area 102 are partially isolated and independent from the flexible substrate 100 with only a small bridge feature 100b partially connecting them with the flexible substrate 100, so that the active areas 100a (including the sensor elements to be formed thereon later) may be nearly unaffected or even immune to the deformation of surrounding flexible substrate 100 through the rotation and shift movement of active areas 100a. In addition, the arrangement of perforations 104 uniformly around every active area 100a may further improve this anti-deformation property.

Figure 2:
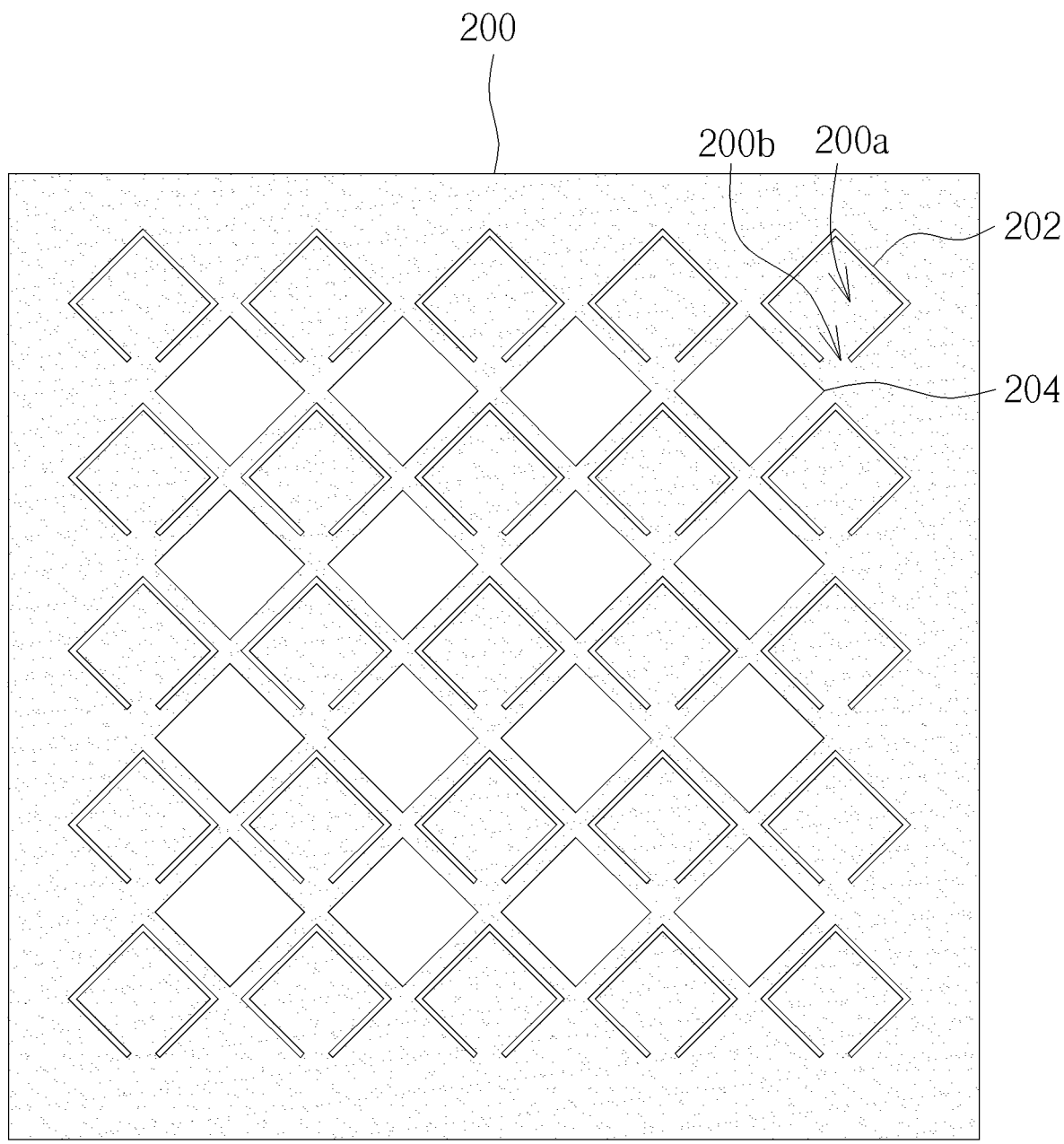
FIG. 2 is a top view of a flexible substrate for the sensor in accordance with another embodiment of present invention.

Please refer to FIG. 2, which is a top view of a flexible substrate for the sensor in accordance with another embodiment of present invention. In the present invention, the active area of flexible substrate and the perforations formed in the flexible substrate may have other shape different from the hexagon of FIG. 1. Generally, the shape of the active area and the perforation are not limited, but preferably a geometrically and rotationally symmetric shape in order to closely and uniformly distribute the patterns of active area and perforation on the substrate plane. As shown in FIG. 2, multiple perforations 204 in diamond shape are formed in the flexible substrate 200. These perforations 204 are arranged on the flexible substrate 200 in an inline array. Furthermore, multiple open-ended moat-like cut-out areas 202 are formed in the flexible substrate 200. Similarly, these open-ended moat-like cut-out areas 202 are arranged on the flexible substrate 204 in an inline array. The combination of perforations 204 and open-ended moat-like cut-out areas 202 are arranged in a staggered array on the flexible substrate 200 as shown in FIG. 2. Each of the open-ended moat-like cut-out areas 202 defines an active area 200a of the flexible substrate 200 in the same diamond shape and dimension as the one of perforation 204 and nearly enclosed by one of the open-ended moat-like cut-out areas 202. The active area 200a is connected with the flexible substrate 200 through a bridge feature 200b that is not enclosed by the open-ended moat-like cut-out area 202.

Figure 3:
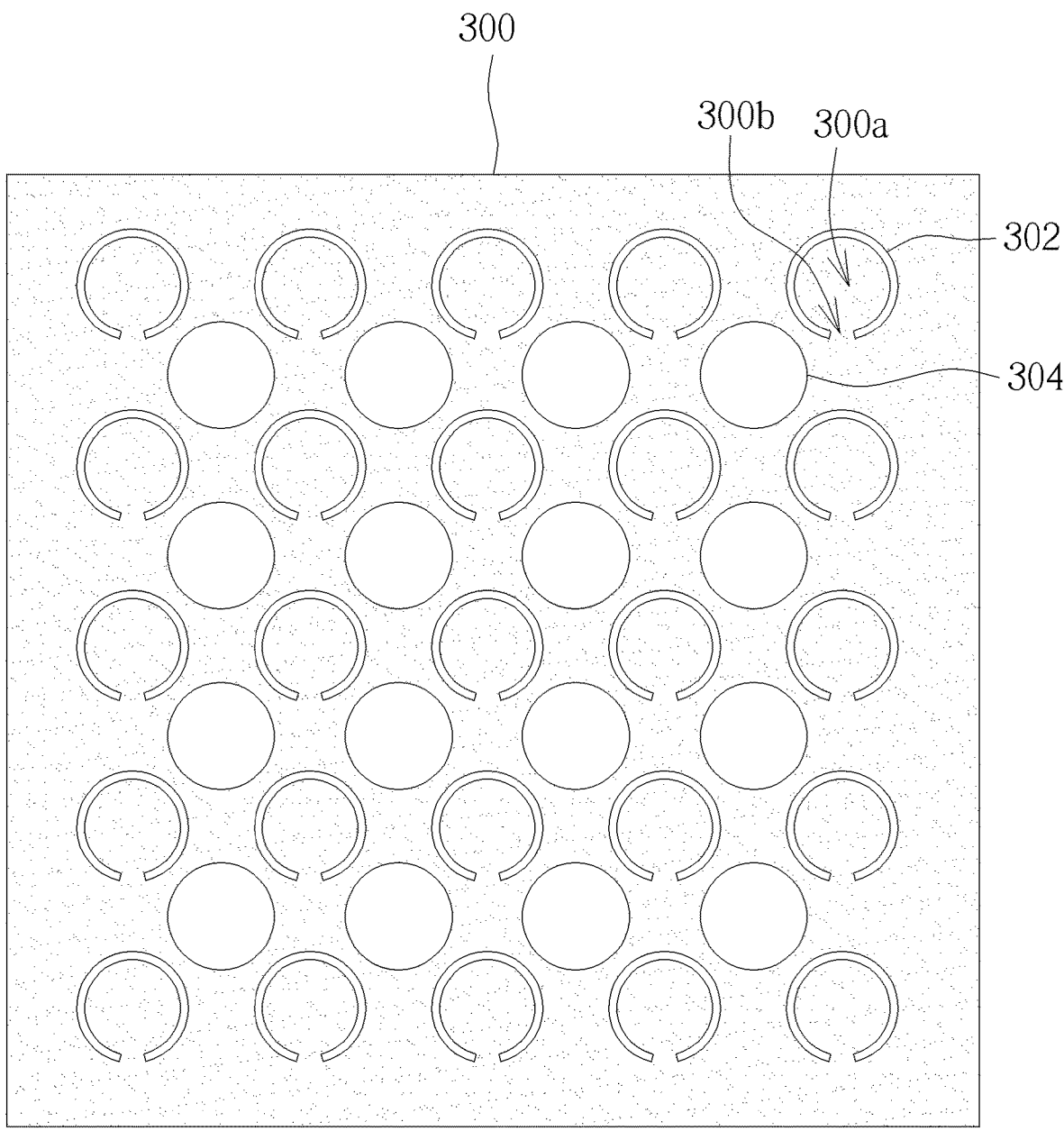
FIG. 3 is a top view of a flexible substrate for the sensor in accordance with still another embodiment of present invention.

Please refer to FIG. 3, which is a top view of a flexible substrate for the sensor in accordance with still another embodiment of present invention. As shown in FIG. 3, multiple perforations 304 in circular shape are formed in the flexible substrate 300. These perforations 304 are arranged on the flexible substrate 300 in an inline array. Furthermore, multiple open-ended moat-like cut-out areas 302 are formed in the flexible substrate 300. Similarly, these open-ended moat-like cut-out areas 302 are arranged on the flexible substrate 300 in an inline array. The combination of perforations 304 and open-ended moat-like cut-out areas 302 are arranged in a staggered array on the flexible substrate 300 as shown in FIG. 3. Each of the open-ended moat-like cut-out areas 302 defines an active area 300a of the flexible substrate 300 in the same diamond shape and dimension as the one of perforation 304 and nearly enclosed by one of the open-ended moat-like cut-out areas 302. The active area 300a is connected with the flexible substrate 300 through a bridge feature 300b that is not enclosed by the open-ended moat-like cut-out area 302.

Figure 4:
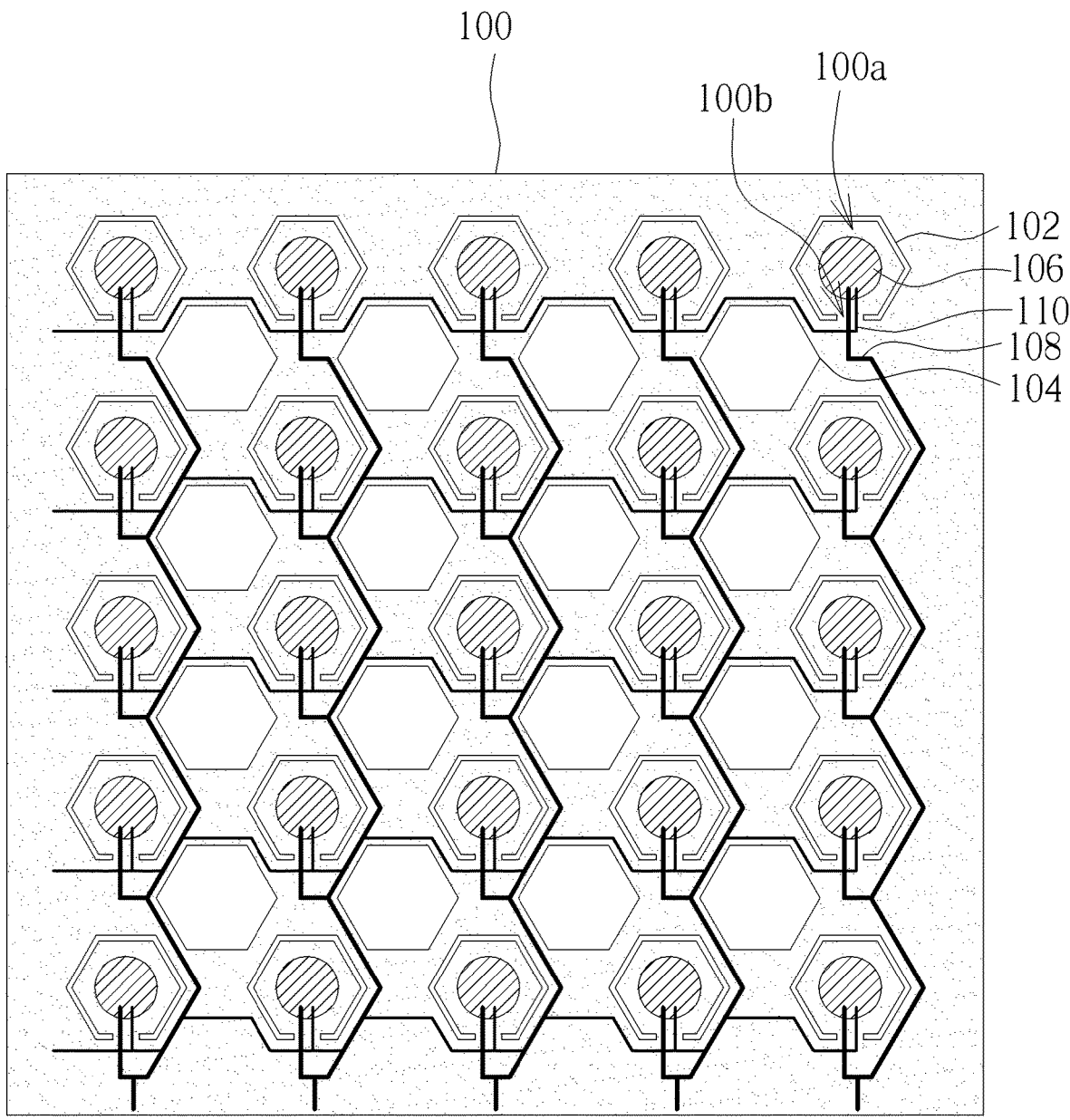
FIG. 4 is a top view of a sensor with sensor elements arranged regularly on a flexible substrate in accordance with one preferred embodiment of present invention.

Please refer to FIG. 4, which is a top view of a sensor with sensor elements arranged regularly on a flexible substrate in accordance with one preferred embodiment of present invention. After the flexible substrate 100 with patterns of the open-ended moat-like cut-out areas 102 and perforations 104 is prepared, the sensor elements 106 and conductive traces (may also be referred as electrodes) 108, 110 are then formed on the prepared flexible substrate. In the embodiment of present invention, each sensor elements 106 is formed on one active area 100a that is defined by one open-ended moat-like cut-out area 102 and partially connected with the flexible substrate 100. The sensor r element 106 is electrically coupled to the conductive trace 108 (i.e. upper electrode) and the conductive trace 110 (i.e. lower electrode). In the embodiment, the conductive traces 108, 110 connect the sensor elements 106 through the bridge features 100b without overlapping the open-ended moat-like cut-out areas 102 and 104 perforations, so that the stretchability of the flexible substrate 100 will not be influenced. When the sensor element 106 is formed as a force sensor, a pressure sensitive layer (not shown) may be disposed between the upper and the lower conductive traces 108, 110 on the sensor element pad. It should be appreciated that the present invention is not limited in this respect and that a sensor element pad need not be employed. An insulating layer (not shown) may be disposed between the conductive traces 108, 110 to isolate them from each other. Each conductive trace 108, 110 may be further connected to a respective terminal or electrical leads (not shown) in peripheral region.

It should be appreciated that although in the embodiment described above, movement of each sensor element is substantially independent of movement of an adjacent sensor element, the present invention is not limited in this respect. For example, groups of two or more sensor elements may be constrained to move together, yet movement of a particular group of sensor elements is substantially independent of the movement of an adjacent sensor element or group of sensor elements.

In the embodiment of present invention, the conductive traces 108, 110 may be formed using any suitable technique. For example, methods for making flexible printed circuits may be employed. In this respect, the upper conductive trace 108 may be applied to the top substrate layer by directly printing an electrically conductive ink. Other methods may be used to fabricate the conductive trace including photo-etching copper or gold laminated to the flexible substrate or other suitable substrate material. Screen printing may also be used. The sensor elements 106 on the conductive traces 108, 110 may be formed by coating a pressure-sensitive ink. Pressure-sensitive inks are materials which can be printed or otherwise applied in a thin coating which serves to limit the current flowing therethrough. When forming the sensor to detect other parameters, such as temperature, other types of sensitive coatings, such as a temperature sensitive coating, may be employed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensor with plurality of sensor elements arranged on a flexible substrate, comprising:
   a flexible substrate;
   multiple perforations formed in said flexible substrate;
   multiple open-ended moat-like cut-out areas formed in said flexible substrate, wherein said perforations and said open-ended moat-like cut-out areas are arranged in a staggered array on said flexible substrate, and each of said open-ended moat-like cut-out areas defines an active area nearly enclosed by one of said open-ended moat-like cut-out areas and connecting said flexible substrate through a bridge feature not enclosed by said open-ended moat-like cut-out area; and
   multiple sensor elements, wherein each of sensor elements is set on one of said active area.

2. The sensor with plurality of sensor elements arranged on a flexible substrate of claim 1, wherein said active area and said perforation have the same shape.

3. The sensor with plurality of sensor elements arranged on a flexible substrate of claim 2, wherein an outline of said active area and said perforation have substantially similar dimension.

4. The sensor with plurality of sensor elements arranged on a flexible substrate of claim 2, wherein said shape is circle or any regular or irregular polygon, comprising hexagon or diamond.

5. The sensor with plurality of sensor elements arranged on a flexible substrate of claim 1, wherein said bridge features face the same direction.

6. The sensor with plurality of sensor elements arranged on a flexible substrate of claim 1, further comprising conductive traces connecting said sensor elements, wherein said conductive traces connect said sensor elements through said bridge features without overlapping said open-ended moat-like cut-out areas and said perforations.

7. The sensor with plurality of sensor elements arranged on a flexible substrate of claim 1, wherein a material of said flexible substrate is fabric, nylon, polyimide (PI), polyamide (PA), polymerized siloxanes, polyurethanes (PU), polyester, thermoplastic polyurethanes (TPU) or polyethylene terephthalate (PET).

* * * * *